United States Patent
Obara

(10) Patent No.: US 6,526,266 B1
(45) Date of Patent: Feb. 25, 2003

(54) TRANSMISSION ELECTRIC POWER CONTROL DEVICE AND CONTROL METHOD

(75) Inventor: Toshio Obara, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/208,120

(22) Filed: Dec. 9, 1998

(30) Foreign Application Priority Data

Dec. 15, 1997 (JP) .............................................. 9-362494

(51) Int. Cl.[7] .................................................. H04Q 7/20
(52) U.S. Cl. ........................................ 455/126; 455/127
(58) Field of Search .................................. 455/115, 126, 455/127, 23, 24, 69, 71, 125, 136, 195.1, 240.1

(56) References Cited

U.S. PATENT DOCUMENTS

| | | | | |
|---|---|---|---|---|
| 5,081,713 A | * | 1/1992 | Miyazaki ...................... | 455/115 |
| 5,485,120 A | * | 1/1996 | Anvari ......................... | 330/149 |
| 5,826,177 A | * | 10/1998 | Uno ............................. | 330/129 |
| 5,852,770 A | * | 12/1998 | Kasamatsu ................... | 330/129 |
| 5,995,813 A | * | 11/1999 | Ishikura et al. .............. | 455/115 |
| 6,070,058 A | * | 5/2000 | Waldroup et al. ........... | 455/126 |
| 6,125,266 A | * | 9/2000 | Matero et al. ............... | 375/296 |

FOREIGN PATENT DOCUMENTS

| EP | 0 524 008 A1 | 1/1993 |
|---|---|---|
| EP | 0 546 693 A1 | 6/1993 |
| EP | 0 549 479 A1 | 6/1993 |

* cited by examiner

Primary Examiner—Dwayne Bost
Assistant Examiner—Jean Alland Gelin
(74) Attorney, Agent, or Firm—Pearne & Gordon LLP

(57) ABSTRACT

A transmission electric power control device includes: a coupler 12, detector 13, electric power amplifier 14, error detection means 15, target value generation means 16, gain variable means 17, control calculation means 18, control calculation parameter generation means 19, modulator 20, control variable addition means 21, transmission electric power control means 22, and transmission electric power designation means 23. In this case, the automatic transmission electric power control feedback loop includes: the coupler 12, detector 13, error detection means 15, control calculation means 18, control calculation parameter generation means 19, transmission electric power designation means 23, control variable addition means 21 and gain variable means 17. When the control calculation parameter in the automatic transmission electric power control feedback loop is made variable according to the transmission electric power designation information and also when the convergence offset value of the loop response characteristic is made variable, it is possible to conduct an electric power control of a high dynamic range, high linearity and high accuracy even if the electric power source control of the electric amplifier is conducted for each transmission electric power and the gate bias control is conducted.

16 Claims, 11 Drawing Sheets

TRANSMISSION ELECTRIC POWER CONTROL DEVICE AND CONTROL METHOD

BACKGROUND OF THE INVENTION

The present invention relates to a transmission electric power control device used for a wireless transmitter of a mobile communication apparatus such as a portable telephone. More particularly, the present invention relates to a transmission electric power control device by which an automatic transmission electric power control function can be realized in a transmitter of which a high dynamic range and high linearity are demanded when an electric power convergence offset is controlled by optimizing a control calculating section calculation parameter in the automatic transmission electric power control feedback group in accordance with a transmission electric power designation value.

A common portable telephone (mobile station) is provided with a function for controlling its transmission electric power according to a distance from the base station to the mobile station. Especially, in the case of a portable telephone of CDMA system, in order to minimize an interference with other stations, a transmission electric power control of a high dynamic range and high linearity is demanded. However, the automatic transmission electric power control for meeting the above demand is not conducted in a wireless transmitter under the present condition.

However, in the above application of a wireless transmitter, it is difficult to obtain an absolute accuracy of output electric power of the wireless transmitter. Therefore, when the mobile station approaches to the base station most closely, there is a possibility of interference with other stations. Further, when the mobile station is most distantly separated from the base station, there is a possibility of disconnection. Especially when a transmission electric power control of high linearity is demanded like a portable telephone of CDMA system, it is difficult to turn off an electric power amplifier when the transmission electric power is decreased. Therefore, it is impossible to reduce an electric current in the case of transmission.

SUMMARY OF THE INVENTION

The present has been accomplished to solve the above conventional problems. It is an object of the present invention to provide a controlling apparatus and controlling method for realizing an automatic transmission electric power control by which a transmitting output electric power can be made to approach a target value when a result of calculation is fed back to a gain variable means, which is a component of the transmitter, after a portion of the transmitting output has been taken out, detected, compared with a reference signal and calculated in a transmitter of which a transmission electric power control of a high dynamic range and high linearity is demanded.

In the transmission electric power control device of the present invention, in order to make the transmission electric power accuracy compatible with the transmission electric power variable accuracy in the transmitter of which a high dynamic range and high linearity are demanded, a feedback loop for conducting an automatic transmission electric power control is formed, and a calculation parameter of the control calculating section, which is a component of the loop, is controlled according to a designation value of transmission electric power of the transmitter.

In order to realized that the automatic transmission electric power control is conducted only when an intensity of transmission electric power is relatively high and that the automatic transmission electric power control is not conducted when an intensity of transmission electric power is relatively low, a changeover means for changing over the feedback loop between the valid and invalid is provided, and also a control means for controlling the control calculation parameter is provided, and they are most appropriately controlled according to the transmission electric power designation value of the transmitter. Due to the foregoing, the electric power absolute accuracy can be compensated in a region in which an intensity of transmission electric power is high, and also the linearity accuracy can be compensated between an electric power range in which the automatic transmission electric power control is valid and an electric power range in which the automatic transmission electric power control is invalid.

In order to turn off the electric power source of the electric power amplifier in a transmission electric power range in which the automatic transmission electric power control is valid, there are provided an electric power source control means of the electric power amplifier, a transmitting signal bypass means used in the case of turning off the electric power source of the electric power amplifier, a changeover means for changing over the feedback loop between the valid and invalid, and a control calculation parameter variable means. In the automatic transmission electric power control operation section, according to the transmission electric power designation value, control of turning on and off the electric power amplifier, bypass control of the transmitting signal and control of changing over the operation point of the gain variable means in the transmitter are linked with each other, so that the transmitter electric current can be reduced when the transmission electric power is decreased. Further, the control calculation parameter is made to be variable, so that the absolute accuracy of the transmitting output electric power and the transmitting output variable quantity accuracy can be maintained high in the transition process to the non-operating section.

According to the present invention, when the calculation parameter of the control calculating section in the automatic transmission electric power control feedback loop is optimized according to the transmission electric power designation value, the electric power convergence offset can be controlled, and the automatic transmission electric power control function can be realized in the transmitter of which a high dynamic range and high linearity are demanded, and further the enhancement of the transmission electric power accuracy and the ensuring of the high linearity can be made to be compatible with each other. Even when the electric power amplifier is turned on and off in the automatic transmission electric power control operating section, it is possible to ensure the transmission electric power variable quantity accuracy. Therefore, it is possible to realize a great reduction of electric power consumption of the transmitter.

According to the first aspect of the present invention, it is provided a transmission electric power control device provided in a transmitting device, the transmitting output electric power of which can be controlled, the transmission electric power control device having a feedback loop comprising: a coupler, a detector, an error detection means, a control calculation means, a control calculation parameter generation means, a transmission electric power designation means, a control variable addition means and a gain control means, so that a control calculation parameter in the feedback loop in automatic transmission electric power control can be controlled and optimized in accordance with the individual transmitting output electric power when automatic transmission electric power control is applied in which a portion of the transmitting output is taken out, detected, compared with a reference signal and calculated and the result of the calculation is fed back to a gain control means which is a component of the transmitter. Due to the above arrangement, it is possible to absorb a change in the response characteristic of the system. As a result, it is possible to realize a transmission electric power control of a high dynamic range, high linearity and high accuracy.

According to the second aspect of the present invention, a method of controlling a transmission electric power used for a transmitting device, the transmitting output electric power of which can be controlled, the method of controlling a transmission electric power having a process of feedback loop comprising: a coupling step, a detecting step, an error detecting step, a control calculation step in which a control calculation parameter for each transmission electric power designation value is used, a control variable addition step, and a gain variable step, so that a control calculation parameter in the feedback loop in automatic transmission electric power control can be controlled and optimized in accordance with the individual transmitting output electric power when automatic transmission electric power control is applied in which a portion of the transmitting output is taken out, detected, compared with a reference signal and calculated, and the result of the calculation is fed back to a gain control means which is a component of the transmitter for maintaining the absolute accuracy of the transmitting output electric power and the variable quantity accuracy of the transmitting output to be high. Due to the above arrangement, it is possible to absorb a change in the response characteristic of the system. As a result, it is possible to realize a transmission electric power control of a high dynamic range, high linearity and high accuracy.

According to the third aspect of the present invention, it is provided a transmission electric power control device provided in a transmitting device, the transmitting output power of which can be controlled, the transmission electric power control device having a feedback loop comprising: a coupler, a detector, an error detection means, a control calculation means, a control calculation parameter generation means, a transmission electric power designation means, a feedback loop changeover means for changing over the feedback loop between the valid and the invalid, a control variable addition means and a gain control means, wherein a means for changing over the feedback loop between the valid and invalid and a control calculation parameter variable means are provided so as to make an operation section and a non-operation section of the automatic transmission electric power control, and a transmission electric power convergence offset value is adjusted in the automatic transmission electric power control in accordance with the individual transmitting output electric power in order to maintain the absolute accuracy of the transmitting output electric power and the variable accuracy of the transmitting output electric power to be high in the transition process from the operating section to the non-operating section, when automatic transmission electric power control is applied in which a portion of the transmitting output is taken out, detected, compared with a reference signal and calculated, and the result of the calculation is fed back to a gain control means which is a component of the transmitter. Due to the above arrangement, it is possible to absorb a change in the response characteristic of the system. As a result, it is possible to realize a transmission electric power control of a high dynamic range, high linearity and high accuracy. Further, it is possible to reduce a dynamic range of the detector, and electric power consumption can be reduced when operation time of the feedback system is reduced.

According to the fourth aspect of the present invention, it is provided a method of controlling a transmission electric power used for a transmitting device, the transmitting output power of which can be controlled, the method of controlling a transmission electric power having the process of feedback loop comprising: a coupling step, a detecting step, an error detecting step, a control calculation step in which a control calculation parameter for each transmission electric power designation value is used, a changeover step for changing over the feedback loop between the valid and invalid in accordance with the transmission electric power designation value, a control variable addition step, and a gain variable step, wherein a means for changing over the feedback loop between the valid and invalid and a control calculation parameter variable means are provided so as to make an operation section and a non-operation section of the automatic transmission electric power control, and a transmission electric power convergence offset value is adjusted in the automatic transmission electric power control in accordance with the individual transmitting output electric power in order to maintain the absolute accuracy of the transmitting output electric power and the variable accuracy of the transmitting output electric power to be high in the transition process from the operating section to the non-operating section, when automatic transmission electric power control is applied in which a portion of the transmitting output is taken out, detected, compared with a reference signal and calculated, and the result of the calculation is fed back to a gain control means which is a component of the transmitter. Due to the above arrangement, it is possible to absorb a change in the response characteristic of the system. As a result, it is possible to realize a transmission electric power control of a high dynamic range, high linearity and high accuracy. Further, it is possible to reduce a dynamic range of the detector, and electric power consumption can be reduced when operation time of the feedback system is reduced. Further, it is possible to realize a control by which the efficiency of the electric power amplifier is optimized in a region in which an intensity of transmission electric power is high. Therefore, it is possible to greatly reduce an intensity of electric current.

According to the fifth aspect of the present invention, it is provided a transmission electric power control device provided in a transmitting device, the transmitting output power of which can be controlled, the transmission electric power control device having a feedback loop comprising: a transmitting signal bypass means, an electric power amplification operation control means, a coupler, a detector, an error detection means, a control calculation means, a control calculation parameter generation means, a transmission electric power designation means, a changeover means for changing over the feedback loop between the valid and invalid, a control variable addition means, and a gain variable means, the transmission electric power control device further comprising: an electric power source control means for controlling an electric power amplifier in the transmitter; a transmitting signal bypass means used when the electric power source of the electric power amplifier is turned off; a changeover means for changing over the feedback loop between the valid and invalid; and a control calculation parameter variable means, wherein an operating section and a non-operating section of automatic transmission electric power control are made, a transmitter current is reduced when the transmission electric power is decreased by the control of turning on and off the electric amplifier in accordance with the transmission electric power designation value in the operating section and also by the bypass control of the transmitting signal and by the changing over control of he operation point of the gain variable means in the transmitter, and a transmission electric power convergence offset value in the automatic transmission electric power control is adjusted in accordance with the individual transmitting output electric power in order to maintain the absolute accuracy of the transmitting output electric power and the variable quantity accuracy of the transmission electric power output to be high, when automatic transmission electric power control is applied in which a portion of the transmitting output is taken out, detected, compared with a reference signal and calculated, and the result of the calculation is fed back to a gain control means which is a component of the transmitter. Due to the above arrangement, it is possible to absorb a change in the response characteristic of the system. As a result, it is possible to realize a transmission electric power control of a high dynamic range, high linearity and high accuracy. Further, it is possible to reduce a dynamic range of the detector, and electric power consumption can be reduced when operation time of the feedback system is reduced. Further, it is possible to avoid an electric current consumption of the electric power amplifier when the transmission electric power is decreased.

According to sixth aspect of the present invention, it is provided a transmission electric power control method provided in a transmitting device, the transmitting output power of which can be controlled, the transmission electric power control method having a feedback loop process comprising: a transmitting signal bypass step, an electric power amplification operation control step, a coupling step, a detecting step, an error detecting step, a control calculating step in which the control calculation parameter for each transmission electric power designation value is used, a changeover means for changing over the feedback loop between the valid and invalid in accordance with a transmission electric power designation value, a control variable addition means, and a gain variable means, the transmission electric power control device comprising: an electric power source control means for controlling an electric power amplifier in the transmitter; a transmitting signal bypass means used when the electric power source of the electric power amplifier is turned off; a changeover means for changing over the feedback loop between the valid and invalid; and a control calculation parameter variable means, wherein an operating section and a non-operating section of automatic transmission electric power control are made, a transmitter current is reduced when the transmission electric power is decreased by the control of turning on and off the electric amplifier in accordance with the transmission electric power designation value in the operating section and also by the bypass control of the transmitting signal and by the changeover control of the operation point of the gain variable means in the transmitter, and a transmission electric power convergence offset value in the automatic transmission electric power control is adjusted in accordance with the individual transmitting output electric power in order to maintain the absolute accuracy of the transmitting output electric power and the variable quantity accuracy of the transmission electric power output to be high, when automatic transmission electric power control is applied in which a portion of the transmitting output is taken out, detected, compared with a reference signal and calculated, and the result of the calculation is fed back to a gain control means which is a component of the transmitter. Due to the above arrangement, it is possible to absorb a change in the response characteristic of the system. As a result, it is possible to realize a transmission electric power control of a high dynamic range, high linearity and high accuracy. Further, it is possible to reduce a dynamic range of the detector, and electric power consumption can be reduced when operation time of the feedback system is reduced. Further, it is possible to realize a control by which the efficiency of the electric power amplifier is optimized in a region in which an intensity of transmission electric power is high. Therefore, it is possible to greatly reduce an intensity of electric current. Further, it is possible to avoid an electric current consumption of the electric power amplifier when the transmission electric power is decreased.

DETAILED DESCRIPTION OF THE PREFERRED EMBODIMENTS

Referring to the accompanying drawings, embodiments of the present invention will be explained as follows.

First Embodiment

Figure 1:
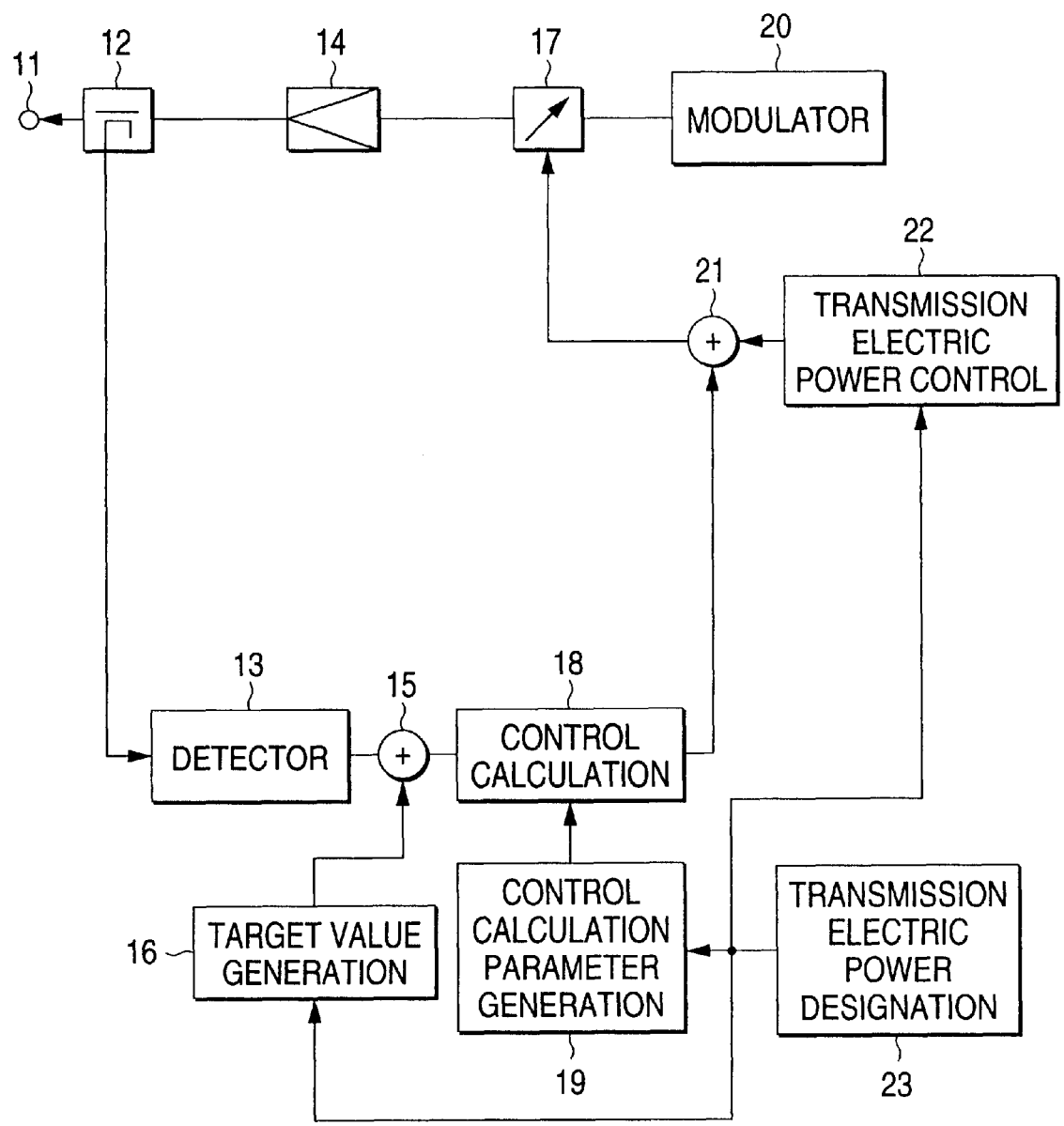
FIG. 1 is a block diagram showing an arrangement of the transmission electric power control device of the first embodiment of the present invention.

FIG. 1 is a block diagram showing an arrangement of the transmission electric power control device of the first embodiment of the present invention. The transmission electric power control device of the first embodiment includes: a coupler 12, detector 13, electric power amplifier 14, error detecting means 15, target value generation means 16, gain variable means 17, control calculation means 18, control calculation parameter generation means 19, modulator 20, control variable addition means 21, transmission electric power control means 22, and transmission electric power designation means 23.

Concerning the above arrangement, its operation will be explained below. First, a modulation signal modulated in the modulator 20 is controlled by the gain variable means 17 in accordance with an output signal sent from the transmission electric power control means 22. Then the modulation signal is amplified by the electric power amplifier 14. After that, the signal is outputted to the transmitting signal output terminal 11 via the coupler 12. On the other hand, a portion of the transmitting signal, which has been amplified by the electric power amplifier 14, is taken out to the detector 13 at the coupler 12 and subjected to detection. The thus detected signal is compared with a target value generated by the target value generation means 16. The result of comparison is inputted into the control calculation means 18. In the control calculation means 18, according to the transmission electric power designation information, the signal is subjected to the processing in which a calculation parameter generated in the parameter generation means 19 is used. A control variable, which is an output signal of the control calculation means 18, is added to an output signal sent from the transmission electric power control means 22, and a control signal of the gain variable means 17 is obtained. As a result, the means described above function as an automatic transmission electric power control feedback loop by which the transmitting output electric power can be made to approach a target value.

In general, when the above automatic transmission electric power control is conducted in a system in which a dynamic range for controlling the transmitting output electric power of a transmitter is wide and an electric power change accuracy is required for each transmission electric power designation, operation points of the gain variable means 17 and detector 13 are different according to the transmission electric power. As a result, the response characteristic of the feedback group is different for each transmission electric power. Therefore, it is difficult to obtain a transmission electric power absolute accuracy and a transmission electric power variable quantity accuracy. Accordingly, in order to obtain a predetermined value of the accuracy, the control calculation parameter generation means 19 is provided, so that the response characteristic of the feedback system can be optimized by this apparatus according to the individual transmission electric power designation.

As described above, this embodiment is arranged so that the control calculation parameter can be optimized for each transmission electric power designation. Due to the above arrangement, it is possible to absorb a change in the response characteristic. As a result, it is possible to realize a transmission electric power control of a high dynamic range, high linearity and high accuracy.

Second Embodiment

Figure 2:
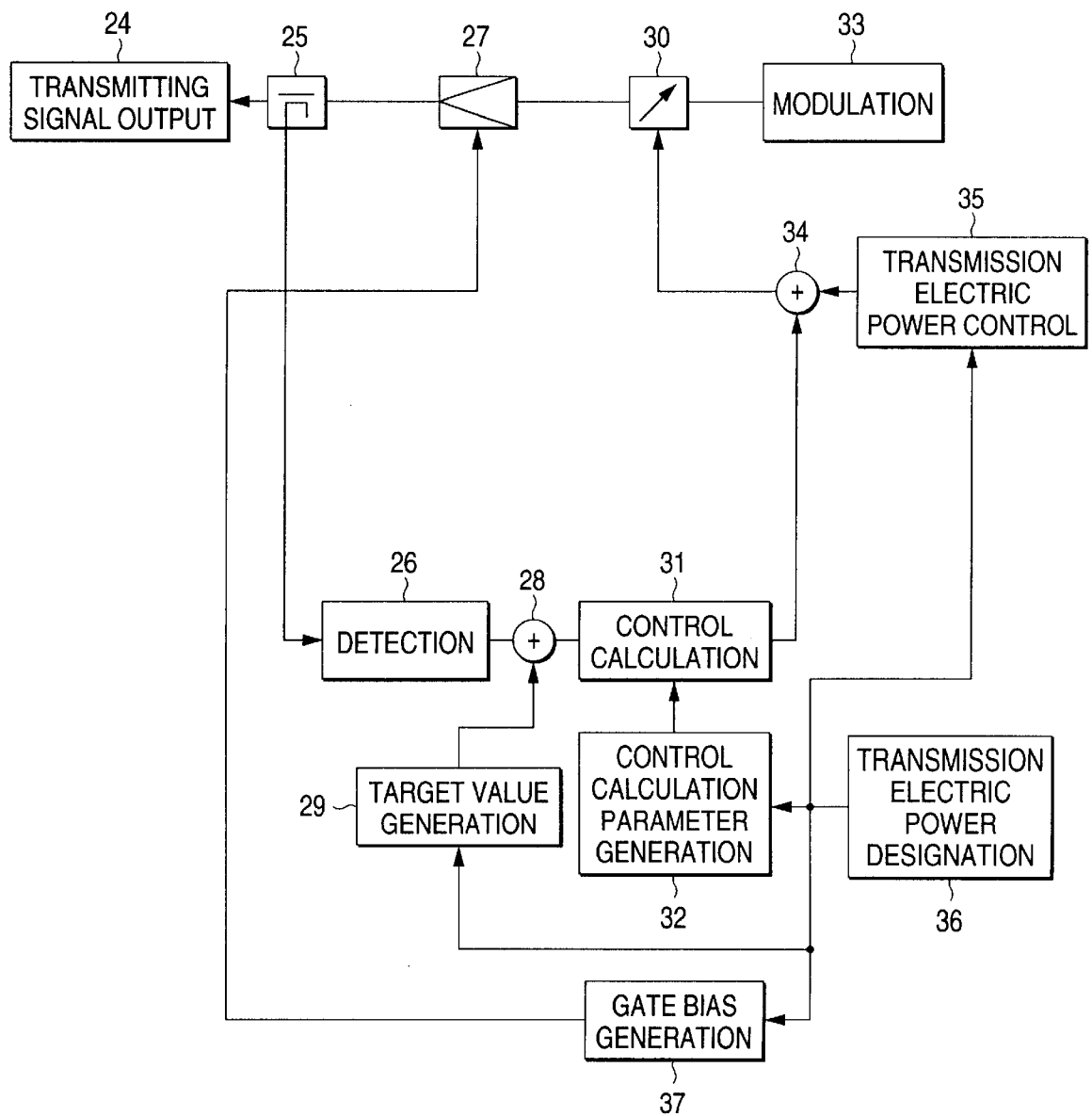
FIG. 2 is a block diagram showing an arrangement of the transmission electric power control device of the second embodiment of the present invention.

Next, the second embodiment of the present invention will be explained below. FIG. 2 is a block diagram showing the transmission electric power control device of the second embodiment of the present invention. In the drawing, reference numeral 24 is a transmitting signal output means reference numeral 25 is a coupling means, reference numeral 26 is a detection means, reference numeral 27 is an electric power amplification means, reference numeral 28 is an error detection means, reference numeral 29 is a target value generation means, reference numeral 30 is a gain variable means, reference numeral 31 is a control calculation means, reference numeral 32 is a control calculation parameter generation means, reference numeral 33 is a modulation means, reference numeral 34 is a control variable addition means, reference numeral 35 is a transmission electric power control means, reference numeral 36 is a transmission electric power designation means, and reference numeral 37 is a gate bias generation means.

Next, its operation will be explained below. First, transmission electric power designation information is sent to each block 29, 32 35, and 37, to which the control line is connected, from the transmission electric power designation means 36. When the transmission electric power designation information is received, a reference value of the transmission electric power control signal is generated in the transmission electric power control means 35, a convergence target value of the automatic transmission electric power control is generated in the target value generation means 29, a control calculation coefficient is generated in the control calculation parameter generation means 32, and a gate bias voltage of the electric power amplifier is generated in the gate bias generation means 37. On the other hand, a transmitting signal modulated in the signal modulation means 33 is first subjected to an electric power adjustment by a reference value of the transmission electric power control signal in the gain variable means 30. At this time, an output of the control calculation means 31 is reset. Next, the transmitting signal is inputted into the electric power amplification means 27 and amplified. Then, the transmitting signal is sent to the transmitting signal output means 24 via the coupling means 25. At this time, the electric power amplification means 27 is controlled by an output signal of the gate bias generation means 37 so that the highest efficiency can be obtained.

On the other hand, a signal detected in the detection means 26 via the coupling means 25 is compared with a target value in the error detection means 28 and sent to the control calculation means 31. Then, the signal is subjected to calculation by the most appropriate parameter in accordance with each transmission electric power designation value. Then, the signal is sent to the control variable addition means 34. In this step, the signal is added to a reference value of the transmission electric power control signal and sent to the gain variable means 30 again. When this feedback flow is repeated, it is possible to obtain a predetermined transmission electric power.

In general, when the above automatic transmission electric power control flow is applied to a system in which a dynamic range for controlling the transmitting output electric power of a transmitter is wide and an electric power change accuracy is required for each transmission electric power designation, the processing performance in the gain variable means 30 and the detection mans 26 is different according to the transmission electric power, and the processing performance in the electric power amplification means 27 is changed by the optimization of the efficiency conducted by the gate bias control. As a result, the response characteristic of the feedback loop is different for each transmission electric power. Therefore, it is difficult to obtain a transmission electric power absolute accuracy and a transmission electric power variable quantity accuracy. Accordingly, in order to obtain a predetermined value of the accuracy, the control calculation parameter generation means 32 is provided, so that the response characteristic of the feedback system can be optimized by this control device according to the individual transmission electric power designation.

As described above, the control device of this embodiment is arranged so that the control calculation parameter can be optimized for each transmission electric power designation. Due to the foregoing, it is possible to absorb a change in the response characteristic. As a result, it is possible to realize a transmission electric power control of a high dynamic range, high linearity and high accuracy. Further, it is possible to greatly improve the efficiency of the electric power amplifier. Therefore, it is possible to realize a reduction of an electric current flowing in the transmitter.

Third Embodiment

Figure 3:
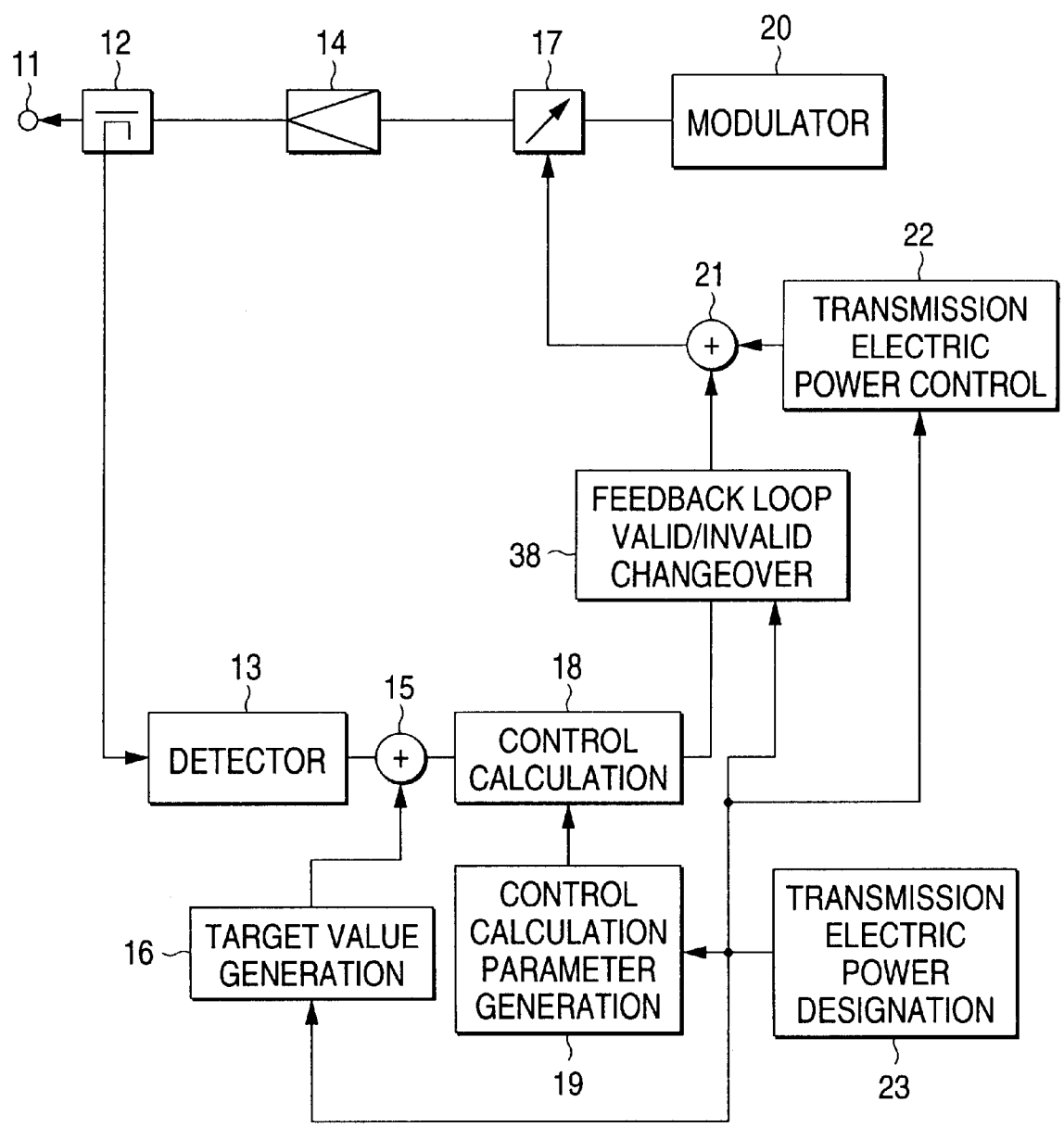
FIG. 3 is a block diagram showing an arrangement of the transmission electric power control device of the third embodiment of the present invention.

Next, the third embodiment of the present invention will be explained below. FIG. 3 is a block diagram showing an arrangement of the transmission electric power control device of the third embodiment of the present invention. Like reference characters are used to indicate like parts in the first and the third embodiment. A difference point between the first and the third embodiment is that a means 38 for changing over the feedback loop between the valid and invalid is arranged n the output side of the control calculation means 18. Other points of the third embodiment are the same as those of the first embodiment.

Due to the above arrangement, it is possible to change over the feedback loop between the valid and invalid, for example, when the absolute accuracy of transmission electric power is required only when the transmitting output is high, or when the detection dynamic range of the detector is small. Further, due to the above arrangement, it is possible to make the control calculation parameter to be variable in the effective section of the feedback loop according to the transmission electric power designation information.

Figure 4:
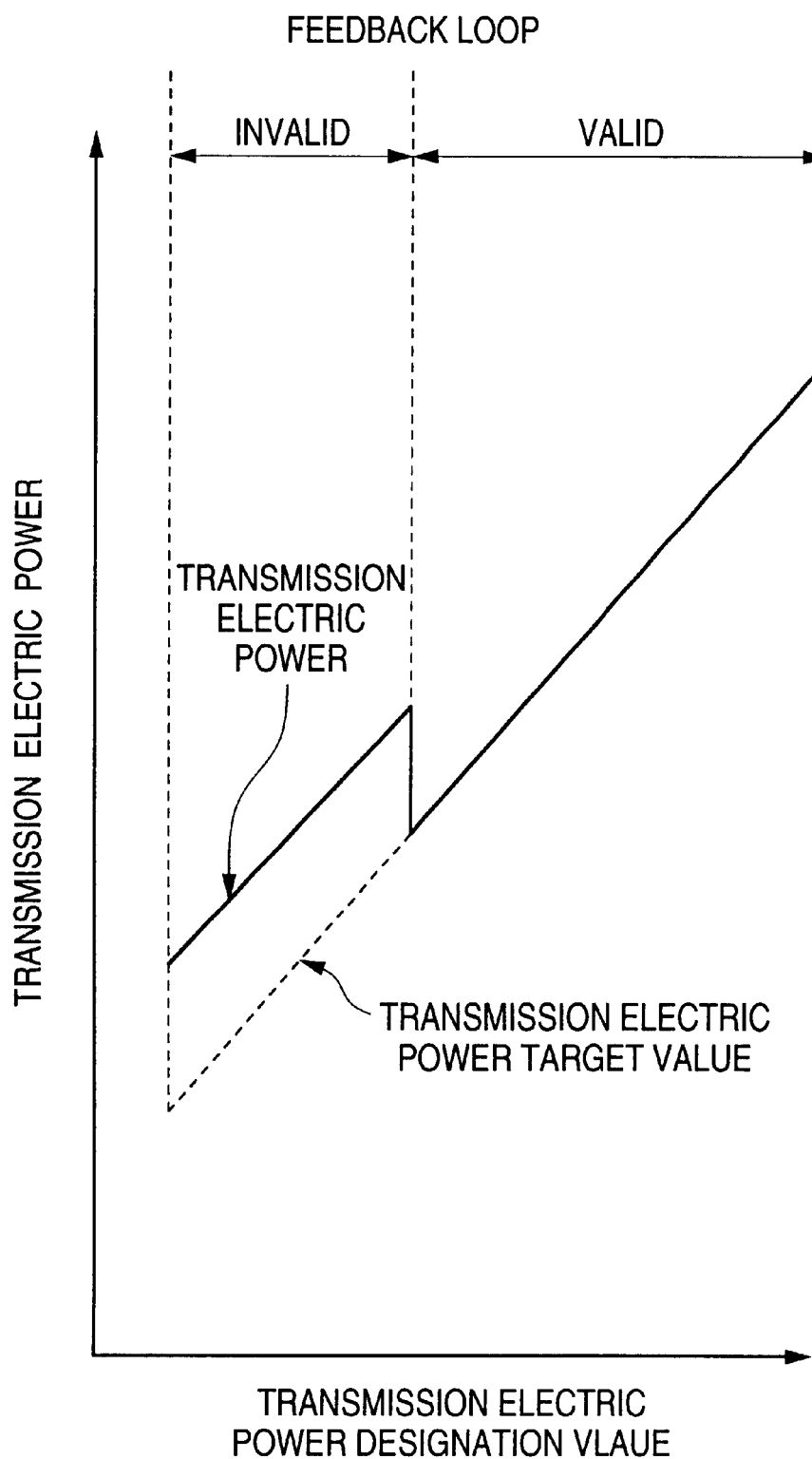
FIG. 4 is a view showing the conventional transmission electric power control characteristic.
Figure 5:
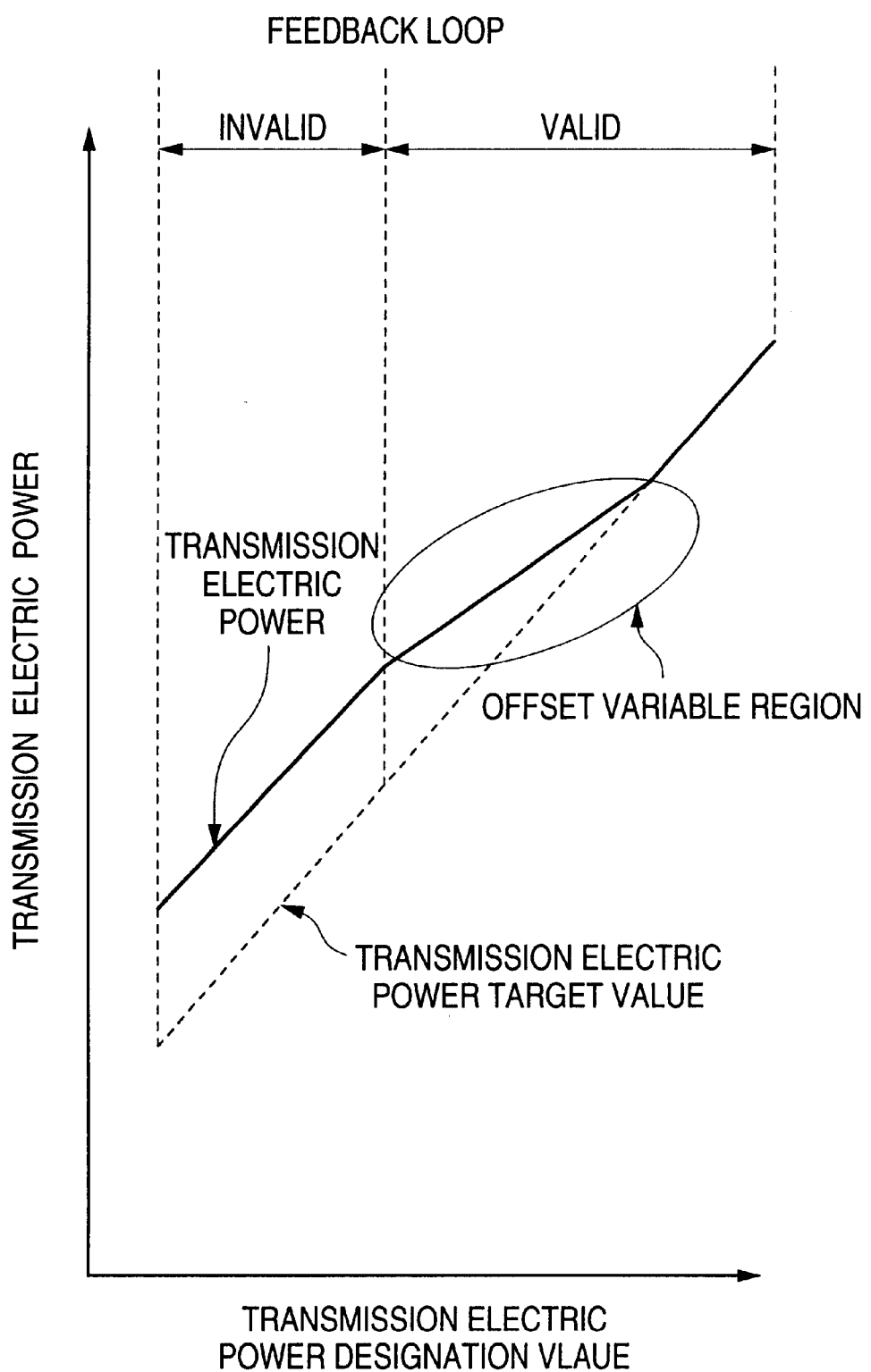
FIG. 5 is a view showing the transmission electric power control characteristic of the third embodiment.

In general, when the above automatic transmission electric power control is performed in a system in which the control dynamic range of the transmitting output electric power of the transmitter is large and the electric power change accuracy is required for each transmission electric power designation, there exists a section, in which the electric power change accuracy can not be obtained, in the boundary between the valid and the invalid section of the feedback loop as shown in FIG. 4. In this embodiment, according to the transmission electric power, the control calculation parameter generation means is provided, and the response characteristic of the feedback system is optimized in accordance with the individual transmission electric power designation, and the offset variable region is provided as shown in FIG. 5. Due to the above arrangement, it is possible to satisfy the electric power change accuracy in the arrangement of this embodiment.

As described above, this embodiment is arranged so that the control calculation parameter can be optimized for each transmission electric power designation. Due to the above arrangement, it is possible to absorb a change in the response characteristic. As a result, it is possible to realize a transmission electric power control of a high dynamic range, high linearity and high accuracy. In this embodiment, the apparatus is composed in such a manner that the automatic transmission electric power control feedback loop can be made valid only when an intensity of transmission electric power is high. Therefore, the dynamic range of the detector can be decreased, and further operation time of the feedback system can be decreased. Due to the foregoing, a reduction of electric power consumption can be realized.

Fourth Embodiment

Figure 6:
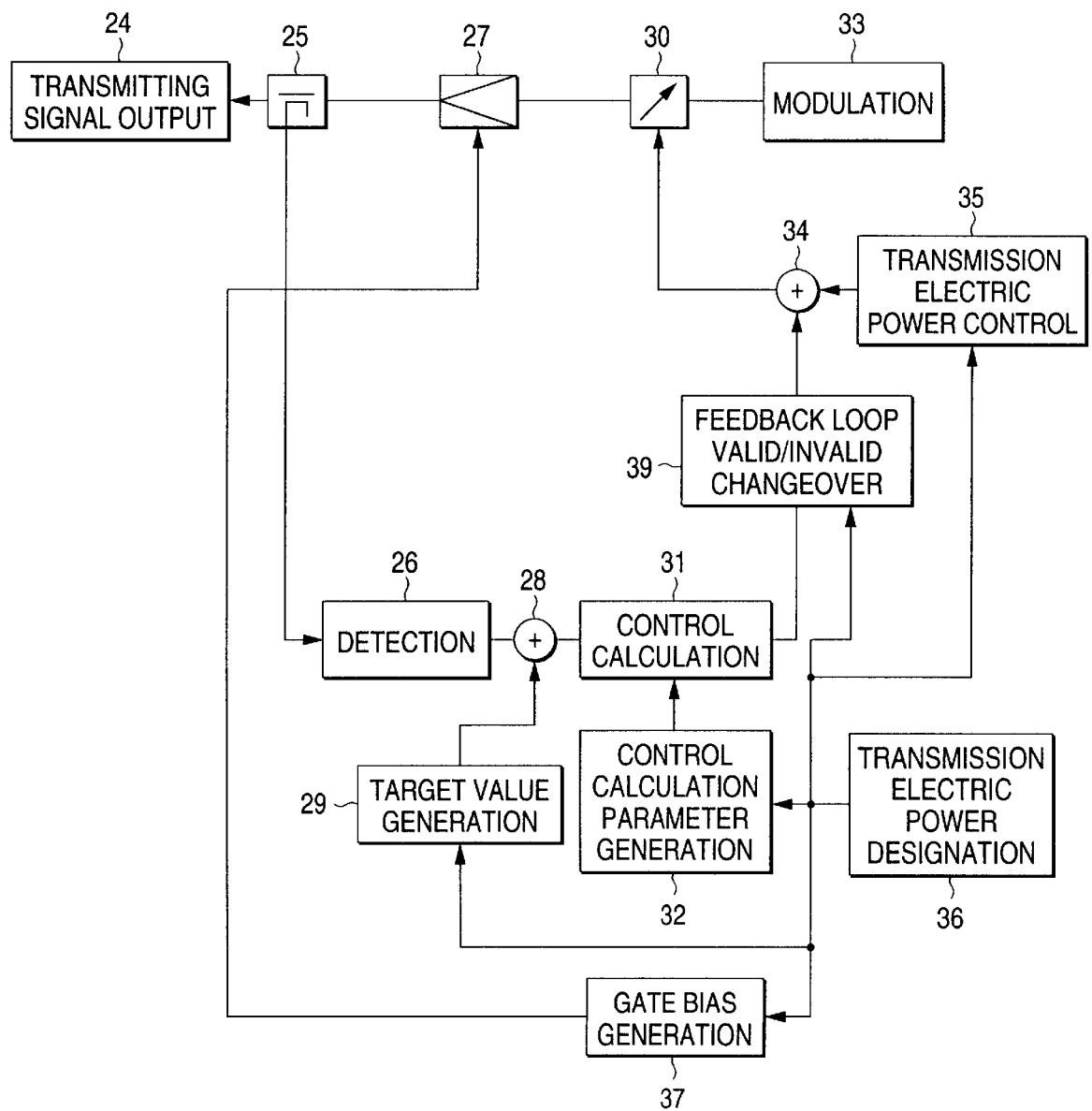
FIG. 6 is a block diagram showing an arrangement of the transmission electric power control device of the fourth embodiment of the present invention.

Next, the fourth embodiment of the present invention will be explained below. FIG. 6 is a block diagram showing an arrangement of the transmission electric power control device of the fourth embodiment of the present invention. Like reference characters are used to indicate like parts in the second and the fourth embodiment. A difference point between the second and the fourth embodiment is that a means 39 for changing over the feedback loop between the valid and invalid is arranged on the output side of the control calculation 31, that is, there is provided a judgment flow to judge whether or not an output from the control calculation 31 is sent to the control variable addition 34 according to the transmission electric power designation value sent from the transmission electric power designation 35. Other points of the fourth embodiment are the same as those of the second embodiment.

Due to the above control method, it is possible to change over the feedback loop between the valid and invalid, for example, when the absolute accuracy of transmission electric power is required only when the transmitting output is high, or when the detection dynamic range of the detector is small. Further, due to the above arrangement, it is possible to make the control calculation parameter to be variable in the effective section of the feedback loop according to the transmission electric power designation information. Further, it is possible to optimize the gate bias of the electric power amplifier according to the transmission electric power designation information in the feedback loop effective section.

Figure 7:
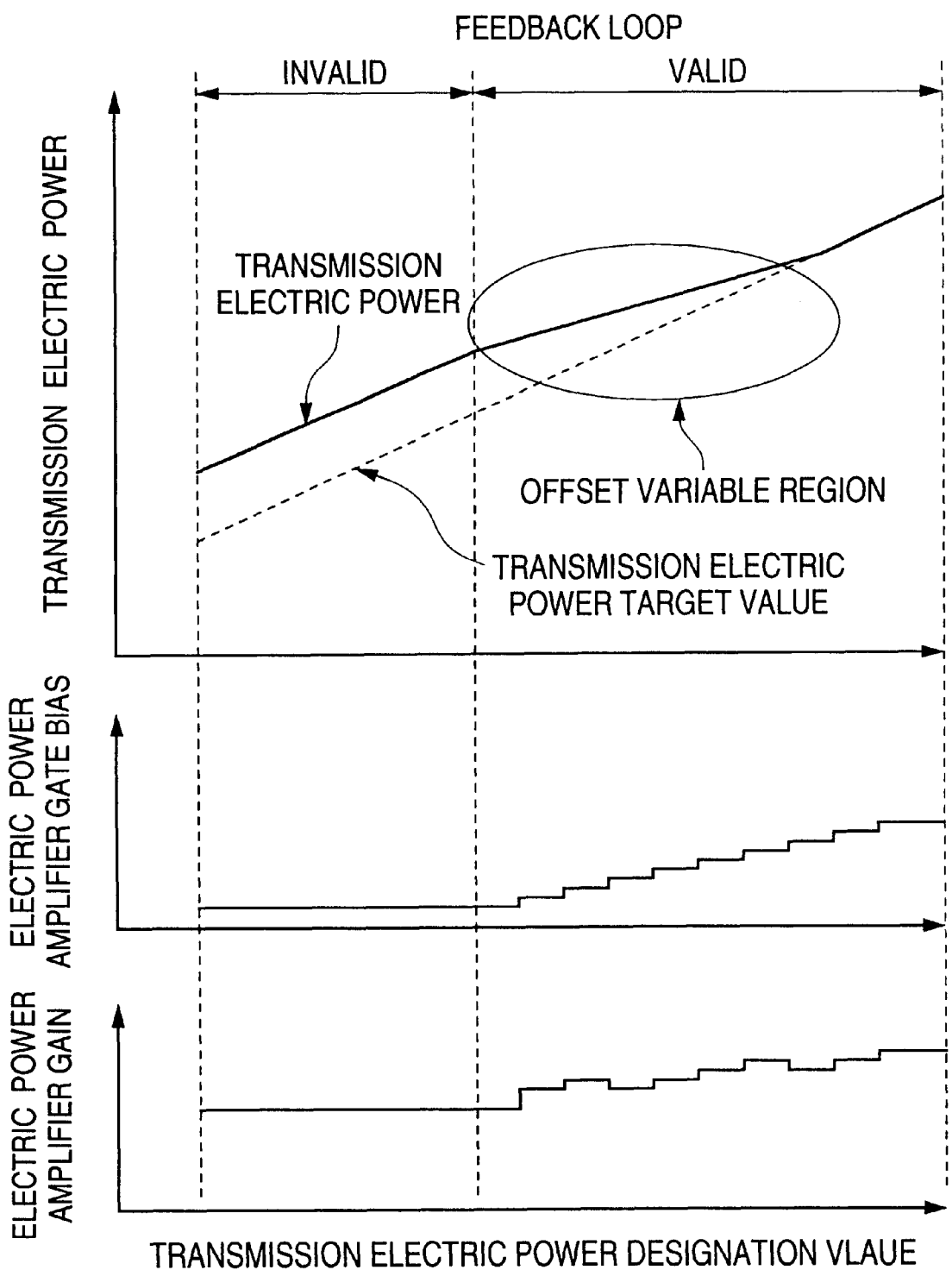
FIG. 7 is a view showing the transmission electric power control characteristic and the electric power amplifier control characteristic of the present invention.

In general, when the above automatic transmission electric power control is performed in a system in which the control dynamic range of the transmission electric power of the transmitter is large and the electric power change accuracy is required for each transmission electric power designation, there exists a section, in which the electric power change accuracy can not be obtained, in the boundary between the valid and the invalid section of the feedback loop as shown in FIG. 4. In this flow, according to the transmission electric power, the control calculation parameter generation is provided, and the response characteristic of the feedback system is optimized in accordance with the individual transmission electric power designation, and the offset variable region is provided as shown in FIG. 7. Due to the above arrangement, it is possible to satisfy the electric power change accuracy by the control device of this embodiment.

As described above, this embodiment is arranged so that the control calculation parameter can be optimized for each transmission electric power designation. Due to the above arrangement, it is possible to absorb a change in the response characteristic. As a result, it is possible to realize a transmission electric power control of a high dynamic range, high linearity and high accuracy. In this embodiment, the apparatus is composed in such a manner that the automatic transmission electric power control feedback loop can be made valid only when an intensity of transmission electric power is high. Therefore, the dynamic range of the detector can be decreased, and further operation time of the feedback system can be decreased. Due to the foregoing, a reduction of electric power consumption can be realized. Further, in a region in which the transmission electric power is high, it is possible to optimize the efficiency of the electric power amplifier as shown in FIG. 7. Therefore, it is possible to greatly reduce an electric current.

Fifth Embodiment

Figure 8:
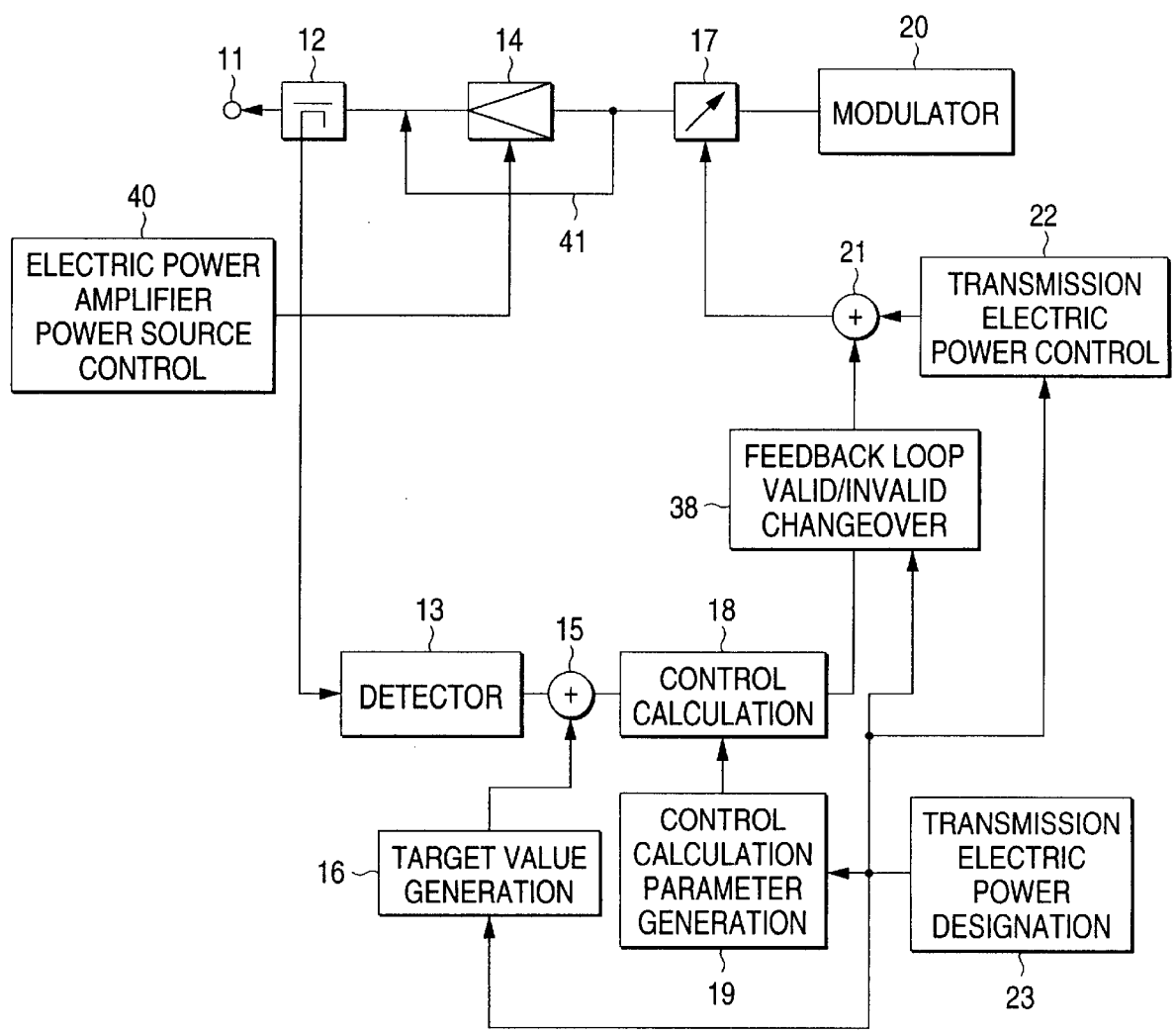
FIG. 8 is a block diagram showing an arrangement of the transmission electric power control device of the fifth embodiment of the present invention.

Next, the fifth embodiment of the present invention will be explained below. FIG. 8 is a block diagram showing an arrangement of the transmission electric power control device of the fifth embodiment of the present invention. Like reference characters are used to indicate like parts in the third and the fifth embodiment. A difference point between the third and the fifth embodiment is that the electric power amplifier power source control means 40 and the transmitting signal bypass means 41 are arranged. Other points of the fifth embodiment are the same as those of the third embodiment.

Figure 9:
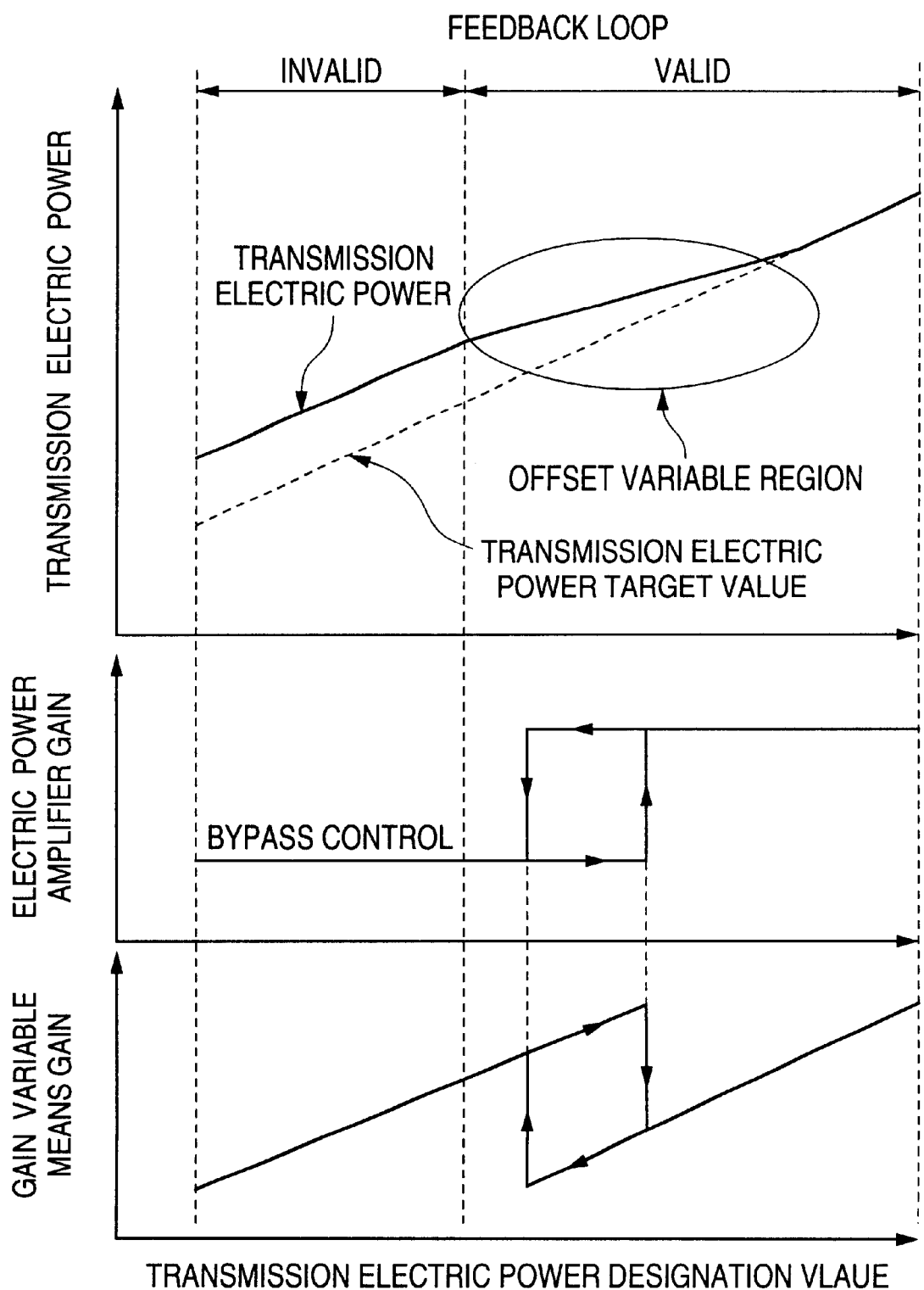
FIG. 9 is a view showing the transmission electric power control characteristic and the electric power amplifier/gain variable means control characteristic of the present invention.

Due to the above arrangement, as shown in FIG. 9, it is possible to realize the electric power source control of the electric power amplifier 14 and the bypass control of the transmitting signal in the effective section of the automatic transmission electric power feedback loop.

In general, when the above bypass control of the electric power amplifier is performed in a system in which the control dynamic range of the transmitting output electric power of the transmitter is large and the electric power change accuracy is required for each transmission electric power designation, it is difficult to satisfy the transmission electric power variable quantity accuracy at a changeover point of operation. In this embodiment, according to the transmission electric power, the control calculation parameter generation means is provided, and the response characteristic of the feedback system is optimized in accordance with the individual transmission electric power designation, and the offset variable region is provided as shown in FIG. 9. Due to the above arrangement, after the bypass control of the electric power amplifier is conducted, it is possible to satisfy the electric power change accuracy in the arrangement of this embodiment.

As described above, this embodiment is arranged so that the control calculation parameter can be optimized for each transmission electric power designation. Due to the above arrangement, it is possible to absorb a change in the response characteristic. As a result, it is possible to realize a transmission electric power control of a high dynamic range, high linearity and high accuracy. In this embodiment, the apparatus is composed in such a manner that the automatic transmission electric power control feedback loop can be made valid only when an intensity of transmission electric power is high. Therefore, the dynamic range of the detector can be decreased, and further operation time of the feedback system can be decreased. Due to the foregoing, a reduction of electric power consumption can be realized. Further, when the electric power source control of the electric power amplifier 14 and the bypass control of the transmitting signal are conducted in the effective section of the automatic transmission electric power control feedback loop, it is possible to avoid an electric current consumption of the electric power amplifier 14 when the transmission electric power is decreased.

Sixth Embodiment

Figure 10:
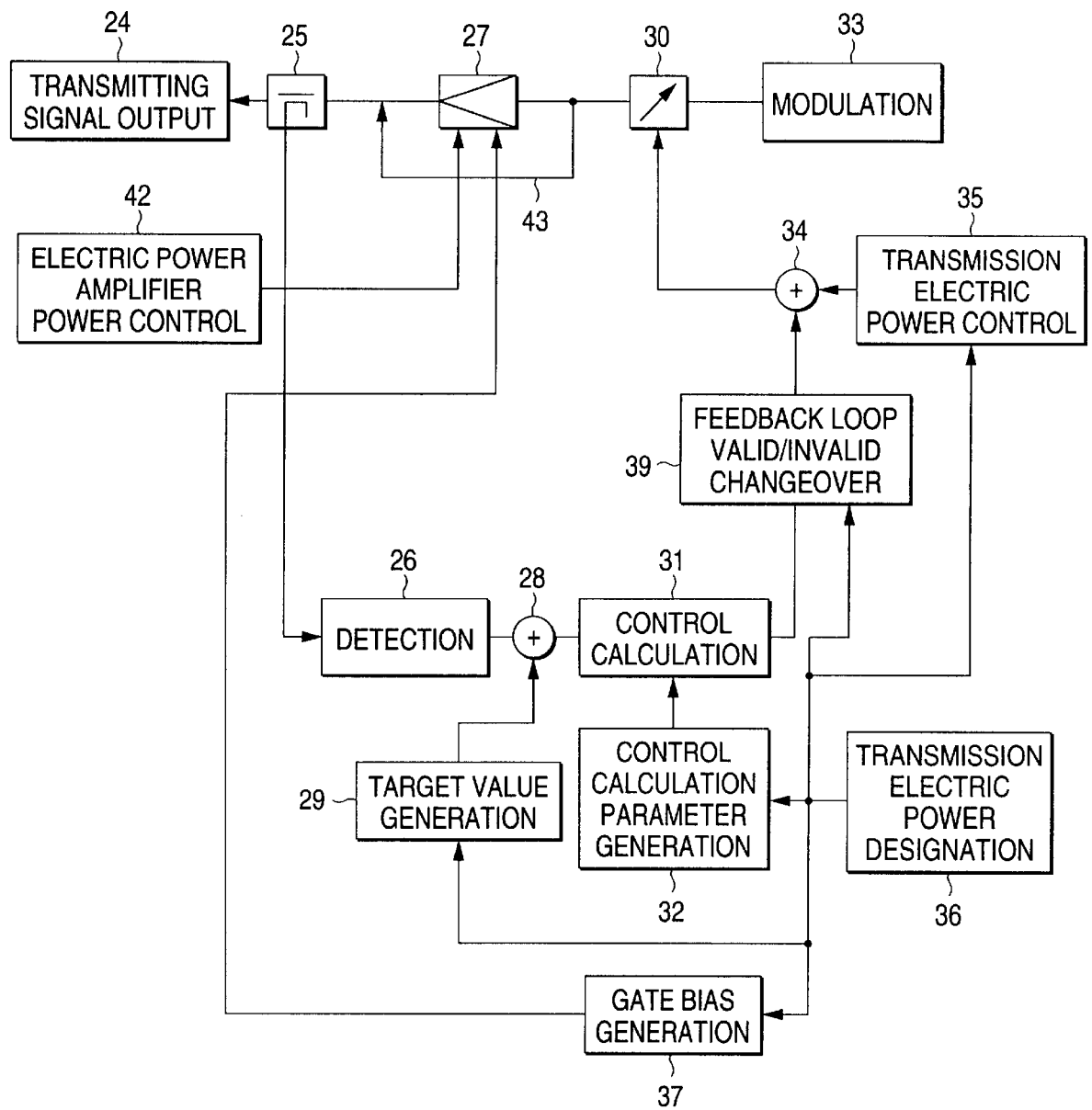
FIG. 10 is a block diagram showing an arrangement of the transmission electric power control device of the sixth embodiment of the present invention.

Next, the sixth embodiment of the present invention will be explained below. FIG. 10 is a block diagram showing the transmission electric power control device of the sixth embodiment of the present invention. Like reference characters are used to indicate like parts in the fourth and the sixth embodiment. A difference point between the fourth and the sixth embodiment is that the electric power amplifier power source control means 42 and the transmitting signal bypass means 43 are provided. Other points of the flow of the sixth embodiment are the same as those of the flow of the fourth embodiment.

When the above control method is adopted, in addition to the control flow shown in the fourth embodiment, it is possible to realize an electric power control flow of the electric power amplifier 14 and a bypass control flow of the transmitting signal in the effective section of the automatic transmission electric power feedback loop.

Figure 11:
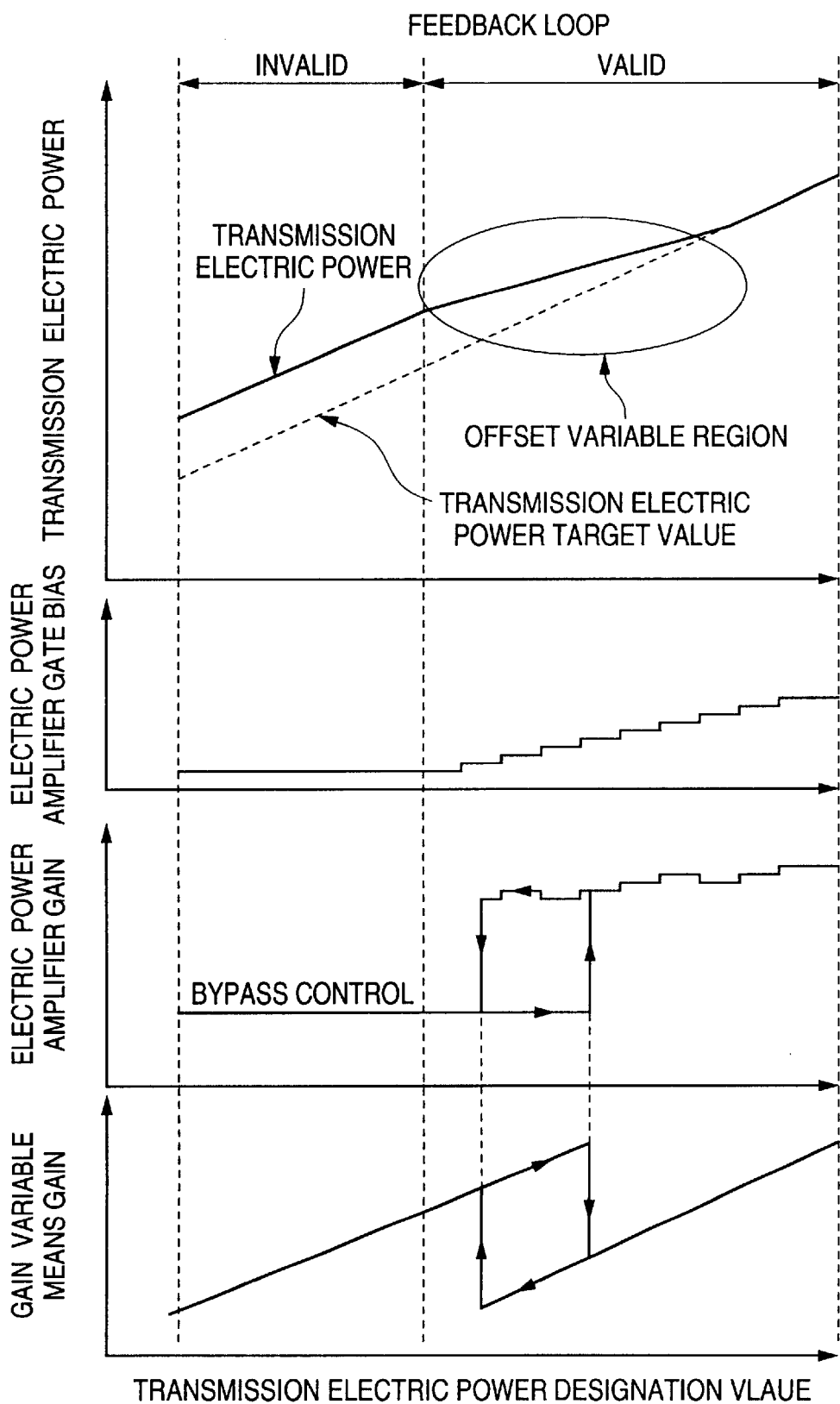
FIG. 11 is a view showing the transmission electric power control characteristic, the electric power amplifier control characteristic and the electric power amplifier/gain variable means control characteristic of the present invention.

In general, when the bypass control of the electric power amplifier and the change in the operation point in the gain variable means are conducted in a system in which the control dynamic range of the transmitting output electric power is large and the electric power change accuracy is required for each transmission electric power designation, it is necessary to set a changeover point in the case where the transmission electric power is decreasing and a changeover point in the case where the transmission electric power is increasing differently from each other as shown in FIG. 11. The calculation parameter of the automatic transmission electric power control is made variable for the individual changeover points, and the response characteristic of the feedback system is optimized according to the individual transmission electric power designation, and the offset variable region is provided as shown in FIG. 11. Due to the forgoing, the control method of this embodiment can provide a satisfactorily high electric power change accuracy.

As described above, this embodiment provides a control method by which the control calculation parameter can be optimized for each transmission electric power designation. Therefore, it is possible to absorb a change in the system. As a result, it is possible to realize a transmission electric power control of a high dynamic range, high linearity and high accuracy. In this embodiment, the apparatus is composed in such a manner that the automatic transmission electric power control feedback loop can be made valid only when an intensity of transmission electric power is high. Therefore, the dynamic range of the detector can be decreased, and further operation time of the feedback system can be decreased. Due to the foregoing, a reduction of electric power consumption can be realized. Further, in a region in which the transmission electric power is high, it is possible to optimize the efficiency of the electric power amplifier as shown in FIG. 11. Therefore, it is possible to greatly reduce an electric current. Further, when the electric power source control of the electric power amplifier 14 is conducted and also the bypass control of the transmitting signal is conducted, it is possible to avoid an electric current consumption in the electric power amplifier 14 in the case of a reduction of the transmission electric power in the effective section of the automatic transmission electric power control feedback loop.

As described above, the present invention can provide the following effects. According to the present invention, when the control calculation parameter of the automatic transmission electric power control feedback loop is made variable according to the transmission electric power designation information, it is possible to conduct a transmission electric power control of a high dynamic range, high linearity and high accuracy. In a system in which the transmission electric power control of high linearity is required, the electric current consumption can be reduced by the gate bypass control of the electric power amplifier for each transmission electric power designation, and the electric current can be reduced by the electric power source control of the electric power amplifier in the case of a reduction of the transmission electric power.

What is claimed is:

1. A transmission electric power control device comprising:

coupling means which extracts a part of a transmitting signal;

detection means which detects a signal extracted by said coupling means;

error detecting means which compares the detection signal with a reference value and outputs an error signal;

transmission electric power designation means which outputs transmission electric power designation information;

control calculation parameter generating means which generates a control calculation parameter corresponding to said transmission electric power designation information;

control calculation means which modifies said error signal according to said control calculation parameter and outputs a control variable;

a transmission electric power control means for generating a transmission electric power control signal according to the transmission electric power designation information output from said transmission electric power designation means;

control variable addition means which adds said control variable with said transmission electric power control signal; and gain variable means which controls a gain according to the output of said control variable addition means; wherein said coupling means, detection means, error detecting means, transmission electric power designation means, control calculation parameter generating means, control calculation means, control variable addition means, transmission electric power control means, and gain variable means constitute a feedback loop so as to perform automatic transmission electric power control.

2. A transmission electric power control device as claimed in claim 1, wherein said reference value to be compared with the detection signal is generated by a target value generation means according to the transmission electric power designation information output from said transmission electric power designation means.

3. A transmission electric power control device as claimed in claim 1, wherein said feedback loop further includes valid/invalid changing over means which changes over the feedback loop between a valid state and an invalid state according to said transmission electric power designation information.

4. A transmission electric power control device as claimed in claim 3, wherein said feedback loop further includes power amplifier means which amplifies an output of said gain variable means, and gate bias generating means which generates a gate bias voltage of said power amplifier means.

5. A transmission electric power control device comprising:

coupling means which extracts a part of a transmitting signal;

detection means which detects a signal extracted by said coupling means;

error detecting means which compares the detection signal with a reference value and outputs an error signal;

transmission electric power designation means which outputs transmission electric power designation information;

control calculation parameter generating means which generates a control calculation parameter corresponding to said transmission electric power designation information;

control calculation means which modifies said error signal according to said control calculation parameter and outputs a control variable;

control variable addition means which adds said control variable with said transmission electric power control signal;

gain variable means which controls a gain according to the output of said control variable addition means; wherein said coupling means, detection means, error detecting means, transmission electric power designation means, control calculation parameter generating means, control calculation means, control variable addition means, and gain variable means constitute a feedback loop so as to a power amplifier means which amplifies an output of said gain variable means, and gate bias generating means which generates a gate bias voltage of said power amplifier means according to said transmission electric power designation information.

6. A transmission electric power control device comprising:

coupling means which extracts a part of a transmitting signal;

detection means which detects a signal extracted by said coupling means;

error detecting means which compares the detection signal with a reference value and outputs an error signal;

transmission electric power designation means which outputs transmission electric power designation information;

control calculation parameter generating means which generates a control calculation parameter corresponding to said transmission electric power designation information;

control calculation means which modifies said error signal according to said control calculation parameter and outputs a control variable;

control variable addition means which adds said control variable with a transmission electric power control signal;

valid/invalid changing over means which changes over the feedback loop between a valid state and an invalid state according to said transmission electric power designation information;

power amplifier means which amplifies an output of said gain variable means;

power source control means which controls a power source of said power amplifier means;

transmission signal bypass means which bypasses the transmission signal when the power source of said power amplifier means is in an off state; and gain variable means which controls a gain according to the output of said control variable addition means; wherein said coupling means, detection means, error detecting means, transmission electric power designation means, control calculation parameter generating means, control calculation means, control variable addition means, valid/invalid changing over means, power amplifier means, transmission signal bypass means and gain variable means constitute a feedback loop so as to perform automatic transmission electric power control.

7. A transmission electric power control device as claimed in claim 6, wherein said feedback loop further includes gate bias generating means which generates a gate bias voltage of said power amplifier means.

8. A base station comprises the transmission electric power control device as claimed in any one of claims 1 to 7.

9. A mobile station comprises the transmission electric power control device as claimed in any one of claims 1 to 7.

10. A transmission electric power control method comprising:

a coupling step which extracts a part of a transmitting signal;

a detection step which detects a signal extracted by said coupling step;

an error detecting step which compares the detection signal with a reference value and outputs an error signal;

a transmission electric power designation step which outputs transmission electric power designation information;

a control calculation parameter generating step which generates a control calculation parameter corresponding to said transmission electric power designation information;

a control calculation step which modifies said error signal according to said control calculation parameter and outputs a control variable;

a transmission electric power control step for generating a transmission electric power control signal according to the transmission electric power designation information output from said transmission electric power designation step;

a control variable addition step which adds said control variable with said transmission electric power control signal; and a gain variable step which controls a gain according to the output of said control variable addition step; wherein said coupling step, detection step, error detecting step, transmission electric power designation step, control calculation parameter generating step, control calculation step, control variable addition step, transmission electric power control step, and gain variable step constitute a feedback loop so as to perform automatic transmission electric power control.

11. A transmission electric power control method as claimed in claim 10, wherein said reference value to be compared with the detection signal is generated by a target value generation step according to the transmission electric power designation information output from said transmission electric power designation step.

12. A transmission electric power control method as claimed in claim 10, wherein said feedback loop further includes valid/invalid changing over step which changes over the feedback loop between a valid state and an invalid state according to said transmission electric power designation information.

13. A transmission electric power control method as claimed in claim 12, wherein said feedback loop further includes power amplifier step which amplifies an output of said gain variable step, and gate bias generating step which generates a gate bias voltage of said power amplifier step.

14. A transmission electric power control method comprising:

a coupling step which extracts a part of a transmitting signal;

a detection step which detects a signal extracted by said coupling step;

an error detecting step which compares the detection signal with a reference value and outputs an error signal;

a transmission electric power designation step which outputs transmission electric power designation information;

a control calculation parameter generating step which generates a control calculation parameter corresponding to said transmission electric power designation information;

a control calculation step which modifies said error signal according to said control calculation parameter and outputs a control variable;

a control variable addition step which adds said control variable with a transmission electric power control signal;

a gain variable step which controls a gain according to the output of said control variable addition step;

a power amplifier step which amplifies an output of said gain variable step; and a gate bias generating step which generates a gate bias voltage of said power amplifier step, wherein said coupling step, detection step, error detecting step, transmission electric power designation step, control calculation parameter generating step, control calculation step, control variable addition step, gain variable step, power amplifier step, and gate bias generating step constitute a feedback loop so as to perform automatic transmission electric power control.

15. A transmission electric power control method comprising:

a coupling step which extracts a part of a transmitting signal;

a detection step which detects a signal extracted by said coupling step;

an error detecting step which compares the detection signal with a reference value and outputs an error signal;

a transmission electric power designation step which outputs transmission electric power designation information;

a control calculation parameter generating step which generates a control calculation parameter corresponding to said transmission electric power designation information;

a control calculation step which modifies said error signal according to said control calculation parameter and outputs a control variable;

a control variable addition step which adds said control variable with a said transmission electric power control signal;

a valid/invalid changing over step which changes over the feedback loop between a valid state and an invalid state according to said transmission electric power designation information;

a power amplifier step which amplifies an output of said gain variable step;

a power source control step which controls a power source of said power amplifier;

a transmission signal bypass step which bypasses the transmission signal when the power source of said power amplifier step is in an off state; and a gain variable step which controls a gain according to the output of said control variable addition step; wherein said coupling step, detection step, error detecting step, transmission electric power designation step, control calculation parameter generating step, control calculation step, control variable addition step, valid/invalid changing over step, power amplifier step, power source.control step, transmission signal bypass step, and gain variable step constitute a feedback loop so as to perform automatic transmission electric power control.

16. A transmission electric power control device as claimed in claim 15, wherein said feedback loop further includes gate bias generating step which generates a gate bias voltage of said power amplifier step.

* * * * *

UNITED STATES PATENT AND TRADEMARK OFFICE
CERTIFICATE OF CORRECTION

PATENT NO.    : 6,526,266 B1
DATED         : February 25, 2003
INVENTOR(S)   : Obara It is certified that error appears in the above-identified patent and that said Letters Patent is hereby corrected as shown below:

Title page,
Item [57], ABSTRACT, please delete the abstract in its entirety, and insert therefor the following paragraph:

-- A transmission electric power control device. When the control calculation parameter in the automatic transmission electric power control feedback loop is made variable according to the transmission electric power designation information and also when the convergence offset value of the loop response characteristic is made variable, it is possible to conduct an elect5ric power control of a high dynamic range, high linearity and high accuracy even if the electric power source control of the electric amplifier is conducted for each transmission electric power and the gate bias control is conducted. --

Column 9,
Line 19, please delete "n", and insert therefor -- on --.

Signed and Sealed this

Fourth Day of November, 2003

JAMES E. ROGAN
*Director of the United States Patent and Trademark Office*